(12) United States Patent
Bonanomi

(10) Patent No.: US 7,285,816 B2
(45) Date of Patent: Oct. 23, 2007

(54) CONTENT ADDRESSABLE MATRIX MEMORY CELL

(75) Inventor: Mauro Bonanomi, Cassano d'Adda (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 248 days.

(21) Appl. No.: 10/926,785

(22) Filed: Aug. 26, 2004

(65) Prior Publication Data

US 2005/0230739 A1    Oct. 20, 2005

(30) Foreign Application Priority Data

Aug. 29, 2003   (EP)   .................................. 03425565

(51) Int. Cl.
*H01L 29/788* (2006.01)
*H01L 29/76* (2006.01)

(52) U.S. Cl. ...................... 257/315; 257/316; 257/319; 257/391

(58) Field of Classification Search ........ 257/315–326, 257/391, 392
See application file for complete search history.

(56) References Cited

U.S. PATENT DOCUMENTS 5,515,320 A    5/1996   Miwa ...................... 365/185.1
6,583,465 B1 *  6/2003   Kim et al. .................. 257/314

FOREIGN PATENT DOCUMENTS

JP           60-18953        1/1985

* cited by examiner

*Primary Examiner*—Hung Vu
(74) *Attorney, Agent, or Firm*—Lisa K. Jorgenson; Timothy L. Boller; Seed IP Law Group PLLC

(57) ABSTRACT

A CAM memory cell integrated on a semiconductor substrate includes a plurality of floating gate memory cells, matrix-organized in rows, called word lines, and columns, called bit lines. The cells belonging to a same row and have floating gate electrodes are short-circuited with each other in order to form a single floating gate electrode for the CAM memory cell. Advantageously, the single floating gate electrode is equipped with at least a cavity manufactured in at least a side wall of the single floating gate electrode. A process for manufacturing CAM memory cells integrated on a semiconductor substrate is also described.

19 Claims, 4 Drawing Sheets

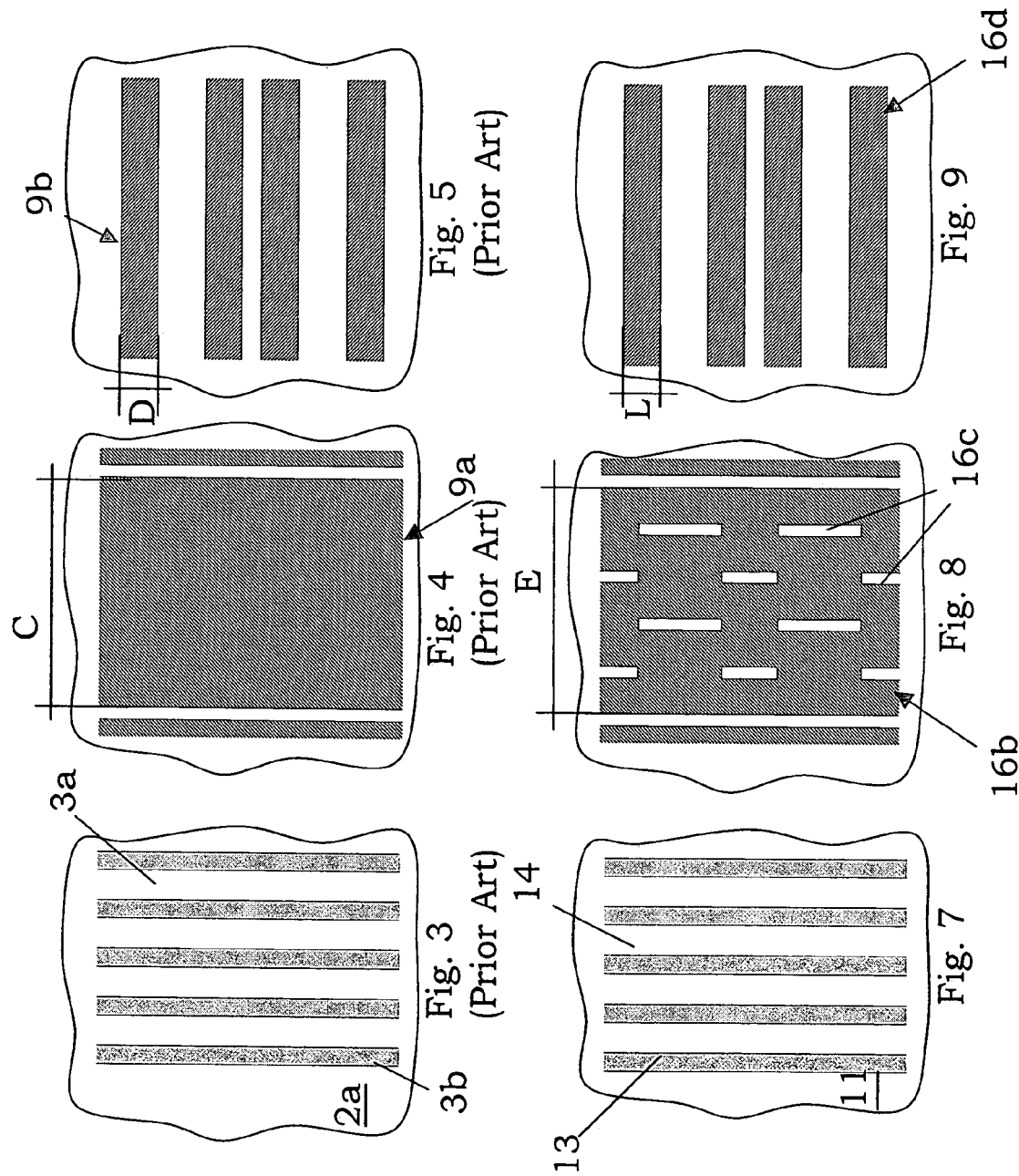

CONTENT ADDRESSABLE MATRIX MEMORY CELL

BACKGROUND OF THE INVENTION

1. Field of the Invention

The present invention relates to a CAM (Content Addressable Matrix) memory cell and corresponding manufacturing process.

More specifically, the invention relates to a CAM memory cell integrated on a semiconductor substrate of the type comprising a plurality of floating gate memory cells, matrix-organized in rows, called word lines, and columns, called bit lines, said cells belonging to a same row and having floating gate electrodes being short-circuited with each other in order to form a single floating gate electrode for said memory cell of the CAM type.

The invention also relates to a process for manufacturing memory cells of the CAM type integrated on a semiconductor substrate.

The invention particularly relates, but not exclusively, to a CAM (Content Addressable Matrix) memory cell integrated on a semiconductor substrate and having a single floating gate electrode and the following description is made with reference to this field of application for convenience of illustration only.

2. Description of the Related Art

As it is well known, EPROM or FLASH-EPROM electronic memory devices integrated on a semiconductor substrate comprise a plurality of matrix-organized non-volatile memory cells; i.e., the cells are organized in rows, called word lines, and columns, called bit lines.

With reference to FIG. 1, a vertical section along a word line is shown, of a plurality of non-volatile memory cells 1 integrated on a semiconductor substrate 2.

In particular, each single non-volatile memory cell 1 is manufactured in correspondence with a respective active area 1b which is insulated from an adjacent cell along a same word line by means of a thick oxide layer 3. Each single cell 1 comprises a MOS transistor wherein the gate electrode 4, located above a channel region and insulated therefrom by means of a thin oxide layer 5, is floating, i.e., it has a high DC impedance towards all the other terminals of the same cell and of the circuit wherein the cell is inserted.

The cell 1 also comprises a second electrode 6, called control gate, which is coupled to the floating gate electrode 4 and insulated therefrom by means of an interpoly oxide layer 7. The control gate terminal 6, as it is known, is driven by convenient control voltages. The other electrodes of the MOS transistor comprised in the cell 1 are the usual drain, source and body terminals.

It is also known that EPROM or FLASH-EPROM electronic memory devices can comprise memory cells of the CAM (Content Addressable Matrix) type, usually used to register configuration information and to use redundancy in electronic memory devices. In particular, CAM memory cells are manufactured by using a plurality of traditional memory cells and they have a common floating gate terminal hanging over a plurality of channel regions of these traditional cells.

CAM memory cells are generally gathered in a sub-matrix spaced from the memory matrix. In particular, also CAM cells are organized in rows, called word lines, and columns, called bit lines.

A known configuration of a CAM memory cell is shown in FIG. 2, represented in vertical section, along a word line, and globally indicated with 8.

In particular, the CAM memory cell 8 comprises five traditional memory cells whose floating gate electrodes are short-circuited with each other to form a single floating gate electrode 9.

In order to increase the reading current of the CAM memory cell 8, it is known to short-circuit four drain electrodes corresponding t the traditional cells and to use them when reading the CAM memory cell 8, the remaining drain electrode is used for programming. In general, given N traditional cells comprised in the CAM memory cell 8, N-1 are short-circuited with each other and used for reading operations, the remaining drain electrode being available for programming operations. The other body and source electrodes are common to all the cells belonging to the same CAM memory cell, similarly to what happens for the cells of a traditional memory device.

With reference to FIGS. 3 to 6, the process for manufacturing a CAM memory cell 8 is now described, as shown in the sectional view of FIG. 2 taken along the line I-I of FIG. 6.

In particular, FIG. 3 illustrates a thick oxide layer 3a formed on a semiconductor substrate 2a that define active areas 3b of the memory cell 8 (FIG. 2), according to the prior art.

Next, referring back to FIG. 2, a thin gate oxide layer 5a is grown, and a first polysilicon layer, called POLY 1, is then deposited and doped.

Through a traditional photolithographic technique the first polysilicon layer POLY 1 is etched to define a first size C, along word lines, of the single floating gate electrode 9 of the CAM memory cell 8. In particular, a first photolithographic mask 9a is used, shown in FIG. 4.

A second size D of the single floating gate electrode 9 is then defined by using a second photolithographic mask 9b, as shown in FIG. 5.

FIG. 6 shows instead an overlapping of the masks 9a and 9b being used wherein the outlines of a plurality of single floating gate electrodes 9 of CAM memory cells 8 are highlighted with thick strokes.

The prior art manufacturing process goes on by foreseeing, traditionally after defining the single floating gate electrodes 9, the growth of an interpoly oxide layer 7a, typically comprising a series of oxide/nitride/oxide layers, called ONO, and the deposition and further etching of a second polysilicon layer to define a control gate electrode 6a of the CAM memory cell 8, as shown in FIG. 2.

The implants for manufacturing the source and drain electrodes of CAM cells 8 formed on the substrate 2a are then manufactured. The memory device is then completed by means of convenient metallization layers.

Although advantageous under several aspects, this known solution has several drawbacks.

In fact, as it can be noticed by comparing FIGS. 1 and 2, the ONO layer 7a area between polysilicon layers, POLY 1 and POLY 2, of the CAM memory cell 8, being said area represented in FIG. 2 along a size and being the other size given by the length D of the single floating gate electrode 9 is smaller than the corresponding area of the sum of the ONO layers 7 of five traditional matrix cells due to the contributions of the thickness A and of the distance B between the electrodes 4 of traditional memory cells 1.

Therefore, it results that the capacitance $C_{PP,CAM}$ of the CAM memory cell 8 between the first and second polysilicon layers, which is proportional to the area of the ONO layer 7a covering the floating gate electrode 9, is lower than the capacitance $C_{PP,5MatrixCells}$ between the first and second polysilicon layer of five traditional memory cells 1. The other capacitances seen by the floating gate electrodes, 4 and 9 respectively, are instead identical in both cases.

The capacitive coupling $\alpha_G$ is defined as the ratio between the capacitance $C_{PP}$ between the first and second polysilicon layers and the overall capacitance $C_{TOT}$ of the cell (i.e., $\alpha_G = C_{PP}/C_{TOT}$). Given that the capacitive coupling $\alpha_G$ of the five traditional memory cells is equal to the coupling of a single memory cell, i.e.:

$$C_{PP,5MatrixCells}/C_{TOT,5MatrixCells} = C_{PP,1MatrixCell}/C_{TOT,1MatrixCell},$$

and the difference in areas between the ONO layer 7a of the CAM memory cell 8 and the ONO layer 7 of a traditional cell 1, a capacitive coupling between the control electrode 6a and the single floating gate electrode 9 of the CAM memory cell 8 is lower than a capacitive coupling between the control gate terminal 6 and the gate electrode 4 of the single traditional matrix cell 1, i.e.:

$$\alpha_{G,CAM} = C_{PP,CAM}/C_{TOT,CAM} \leq \alpha_{G,1MatrixCell} = C_{PP,1MatrixCell}/C_{TOT,1MatrixCell}.$$

The known configuration of the CAM memory cells 8 thus implies less efficient performances, mainly a considerable extension of cancellation times with respect to a traditional cell 1.

BRIEF SUMMARY OF THE INVENTION

An embodiment of the present invention provides a CAM memory cell, having such structural and functional features as to provide a capacitive coupling $\alpha_G$ similar to a traditional memory cell, thus overcoming the limits and drawbacks still affecting prior art memory devices.

One embodiment of the present invention manufactures a CAM memory cell having a single floating electrode, obtained by short-circuiting floating gate electrodes of traditional memory cells being adjacent with each other and belonging to a same word line, wherein the single floating gate electrode is equipped with cavities.

BRIEF DESCRIPTION OF THE SEVERAL VIEWS OF THE DRAWINGS

The features and advantages of the CAM memory cell according to the invention will be apparent from the following description of an embodiment thereof given by way of non-limiting example with reference to the attached drawings.

In these drawings:

FIGS. 3 to 6 show some steps of a process for manufacturing traditional CAM memory cells, according to the prior art;

FIGS. 7 to 10 show some steps of a first embodiment of a process for manufacturing CAM memory cells, according to the invention;

DETAILED DESCRIPTION OF THE INVENTION

With reference to the FIGS. 7-14, a CAM (Content Addressable Matrix) memory cell and a corresponding manufacturing process are described.

The process steps described hereafter do not form a complete process flow for manufacturing integrated circuits. The present invention can be implemented together with the integrated circuit manufacturing techniques presently used in this field and only those commonly used process steps which are necessary to understand the invention are included in the description.

The figures representing cross sections of integrated circuit portions during the manufacturing are not drawn to scale, but they are drawn instead in order to show the important features of the invention.

As mentioned with reference to the prior art, CAM memory cells are matrix-organized inside a memory device; i.e., these cells are organized in rows, called word lines, and columns, called bit lines.

Figure 13:
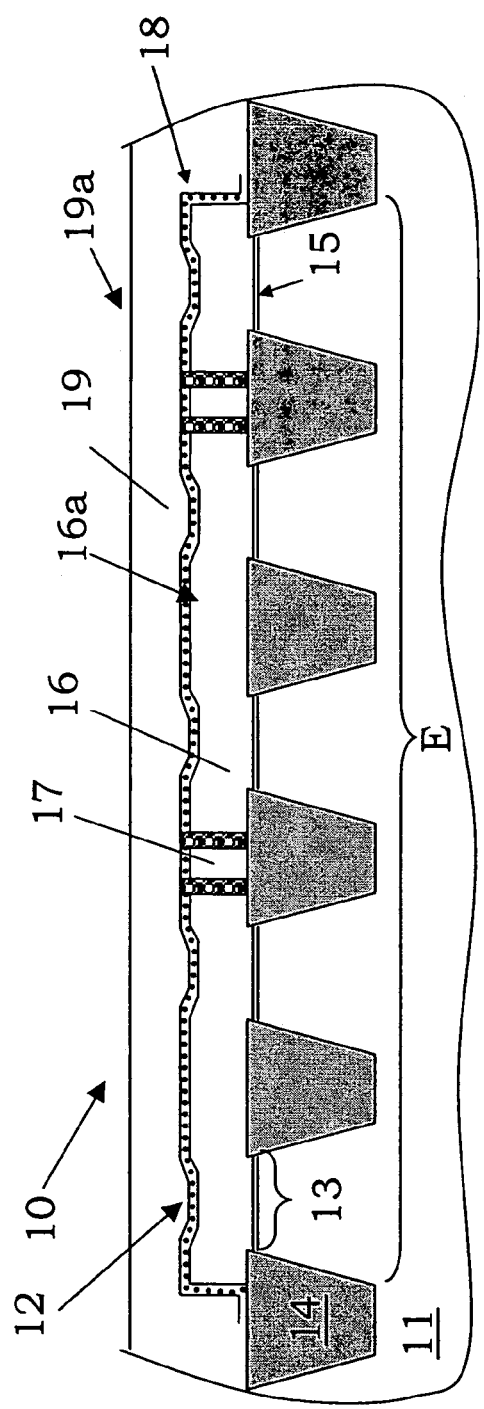
FIG. 13 shows a CAM memory cell, according to one embodiment of the invention.

In particular, with reference to FIG. 13, a CAM memory cell 10 manufactured according to the invention and integrated on a semiconductor substrate 11 is now described, which comprises a plurality of traditional memory cells 12.

In the example of FIG. 13, the CAM memory cell 10 comprises five traditional memory cells 12, belonging to the same word line and each one is manufactured in a respective active area 13 delimited by a thick insulating layer 14. Each traditional memory cell 12 comprises a MOS transistor having a floating gate electrode insulated from the semiconductor substrate 11 by means of a thin insulating layer 15 and respective source and drain electrodes manufactured in the semiconductor substrate 11. The five floating gate electrodes of the memory cells 12 are also short-circuited with each other in order to form a single floating gate electrode 16 of the CAM memory cell 10.

Typically, four drain electrodes of the memory cells 12 are short-circuited with each other and used to read the CAM memory cell 10, while the remaining drain electrode is used to program this CAM memory cell 10. Moreover, the body and source electrodes are common to all the CAM cells 10 belonging to the same matrix, similarly to what happens for traditional memory cell devices.

Figure 14:
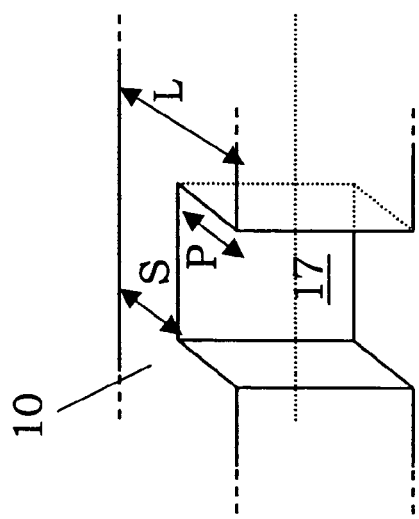
FIG. 14 is a perspective view of a portion of a floating gate electrode of a CAM memory cell, according to the invention.

According to one embodiment of the invention, the floating gate electrode 16 has at least a cavity 17 on the side walls as shown in FIG. 14. Advantageously, the floating gate electrode 16 has a plurality of cavities 17 manufactured in correspondence with the thick insulating layer 14.

Figure 10:
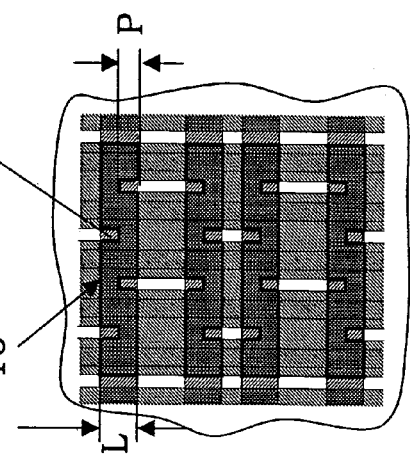

Being L the length of the floating gate electrode 16 and P the depth of each cavity 17, in the embodiment shown in FIGS. 10 and 14, the depth P is substantially equal to half the length of the floating gate electrode 16, i.e., $P \approx L/2$.

In particular, as illustrated in FIG. 10, cavities 17 are manufactured in an alternating sequence (also referred to as an asymmetrical distribution) along the side walls of the floating gate electrode 16 corresponding to sides of the CAM memory cells 10 wherein the source and drain electrodes are manufactured. FIG. 8 illustrates a first photolithographic mask 16b with an asymmetric distribution of openings 16c that correspond to the alternating sequence of cavities.

An interpoly insulating layer 18, example an ONO layer, covers the floating gate electrode 16. A second conductive layer 19a, for example a polysilicon layer called POLY 2, formed on the interpoly insulating layer 18 manufactures the control gate electrode 19 of the CAM memory cell 10.

Figure 1:
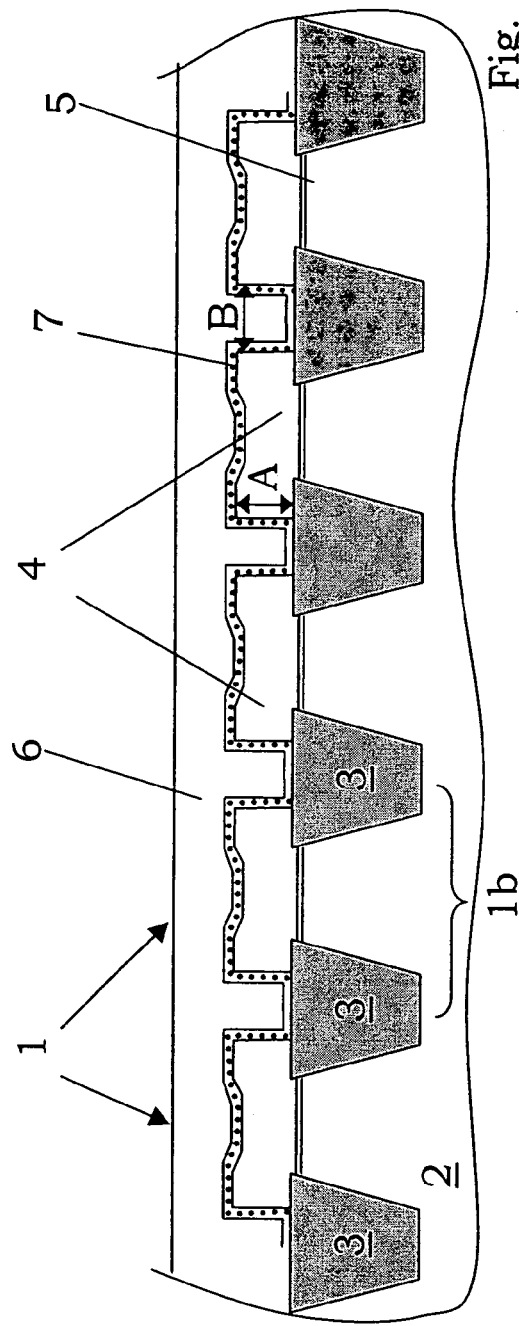
FIG. 1 is a sectional view of a portion of a memory device comprising traditional memory cells, according to the prior art.
Figure 2:
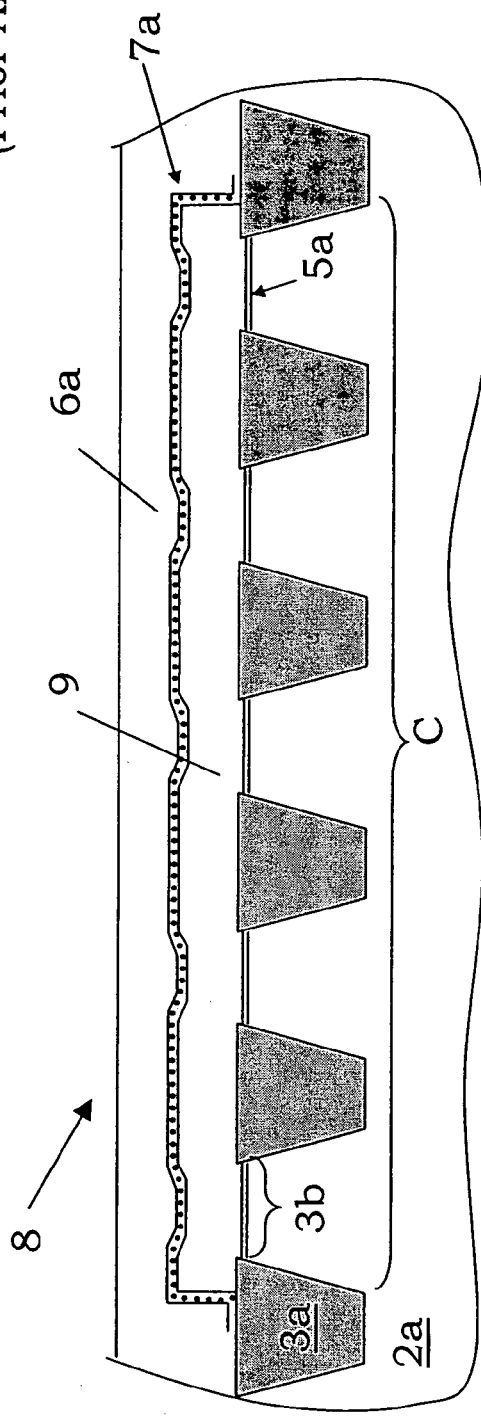
FIG. 2 is a sectional view of a portion of a memory device comprising a traditional CAM memory cell, according to the prior art.

With respect to prior art CAM memory cells 8 (FIG. 2), the area of the interpoly insulating layer 18 of the CAM memory cell 10 is increased. In particular, the CAM memory cell 10 of the present invention may have a net area gain of up to 20-30% over the CAM memory cell 8 of the prior art, which increases the capacitive coupling of the CAM memory cell 10 to values close to the traditional memory cell 1.

In an alternative embodiment of the CAM memory cell according to the invention, cavities 17 are manufactured only in correspondence with the side of the cell 10 wherein the source electrode is manufactured or only in correspondence with the side of the cell 10 wherein the drain electrode is manufactured.

Actually, this embodiment requires a much higher precision in mask alignment since, even for small misalignments, an unacceptable leakage of the capacitive coupling values occurs.

Figure 11:
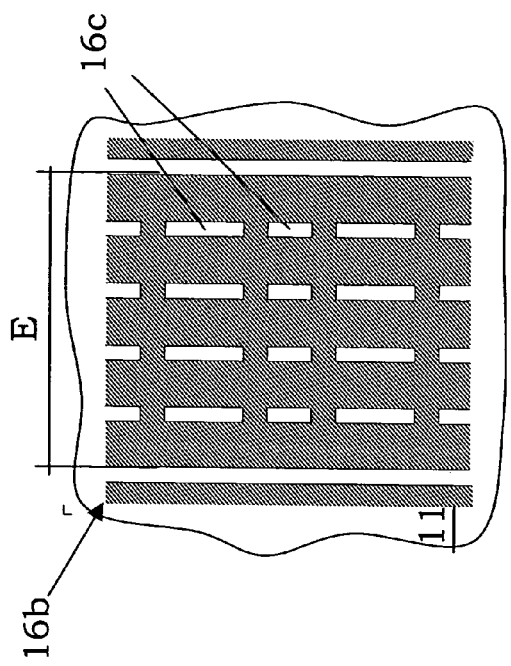
FIGS. 11 to 12 show some steps of a second embodiment of a process for manufacturing CAM memory cells, according to the invention.
Figure 12:
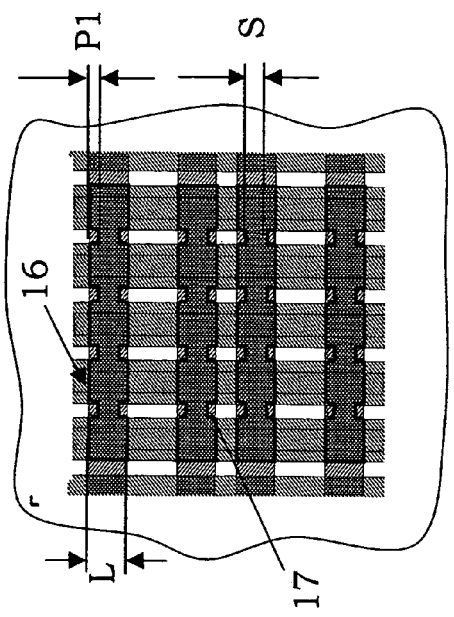
Figure 6:
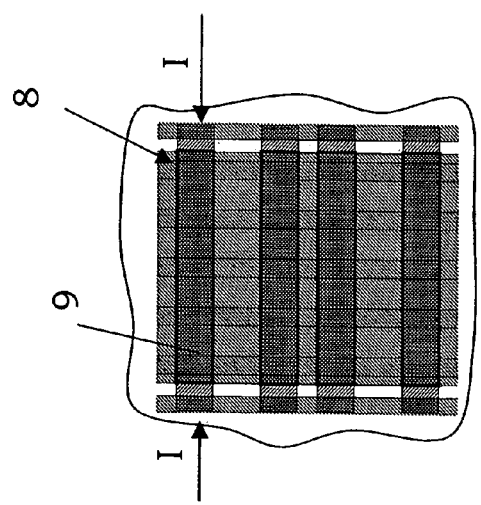

According to a further alternative embodiment, as shown in FIG. 12, cavities 17 are symmetrically manufactured on two side walls of the floating gate electrode 16 and they have a depth P1. That is, both cavities of a pair of cavities are located directly opposite each other in the side walls of the floating gate electrode 16. FIG. 11 illustrates another first photolithographic mask 16b with a symmetric distribution of openings. 16c that correspond to the symmetrical distribution of notches on the two side walls of the floating gate electrode 16.

In particular, the presence of symmetrical cavities with depth P1 in the floating gate electrodes 16 allows the effect of a possible mask misalignment for values lower than P1 to be partially nullified.

The possibility to nullify partially the effect of a possible mask misalignment is also convenient for the manufacturing with cavities alternatively located as shown in FIGS. 8 and 10, when said manufacturing has the same number of cavities 17 on both sides of the floating gate electrode 16.

Clearly, the distance S between two symmetrical cavities must be equal to the minimum length on the floating gate electrode 16, and it must be sufficiently lower than the length L of this electrode in order to allow deposition in the cavities 17 of the conductive layer 19a and in the meantime sufficiently thick to resist to etching after the definition of the control gate electrode 19.

With reference to FIGS. 7 to 13, the manufacturing process of a CAM memory cell 10 according to the invention is now described.

In particular, a thick insulating layer 14, for example oxide, is formed on a semiconductor substrate 11 in order to define active areas 13 of floating gate memory cells 12.

Afterwards, a thin gate insulating layer 15, for example oxide, is grown and a first conductive layer 16a, for example a polysilicon layer called POLY 1, is then formed.

As shown in FIG. 8, by means of a traditional photolithographic technique using a first photolithographic mask 16b, the first conductive layer 16a is etched to define a first size E, along the word lines, of a single floating gate electrode 16 of the CAM memory cell 10.

According to one embodiment of the invention, the first photolithographic mask 16b is equipped with a plurality of openings 16c which are partially aligned with portions of the first conductive layer 16a which will manufacture the single final floating gate electrode 16. Therefore, during the etching step of the first conductive layer 16a, those portions of the first conductive layer 16a being exposed from openings 16c are also removed.

Advantageously, these openings 16c are manufactured in correspondence with the thick insulating layer 14.

The second size L of the single floating gate electrode 16 is then defined through a traditional photolithographic technique which uses a second photolithographic mask 16d, shown in FIG. 9.

After a second etching step of the first conductive layer 16a by means of the second photolithographic mask 16d, the single floating gate electrode 16 is then formed, equipped with cavities 17 on the side walls obtained by removing the first conductive layer 16a in correspondence with openings 16c.

FIG. 10 shows an overlapping of the masks used in the process according to the invention wherein the outlines of the floating gate electrodes 16 of CAM memory cells 10 according to one embodiment of the invention have been highlighted with thick strokes.

According to one embodiment of the invention, by varying the arrangement of openings 16c, different positions and depths of cavities 17 can be defined in the side walls of the floating gate electrode 16. For example, FIG. 11 shows an alternative embodiment of the first photolithographic mask 16b having a symmetric distribution of openings 16c for defining a symmetric distribution of cavities in the single floating gate electrode 16 as illustrated in FIG. 12.

Referring to FIG. 13, and according to the invention, final manufacturing process steps include formation of an interpoly insulating layer 18 on the floating gate electrode 16. The interpoly insulating layer 18 is for example an oxide layer typically comprising a series of oxide/nitride/oxide layers, called ONO. A control gate electrode 19 is then defined, manufactured by means of a second conductive layer 19a.

The implants for manufacturing the source and drain electrodes of CAM cells 10 are then manufactured. The memory device is then completed by means of convenient metallization levels.

In conclusion, CAM memory cells according to some embodiments of the invention allow reduced cancellation times and generally more efficient performances to be obtained, in line with traditional matrix cells. This is done through an alternative drawing of the floating gate electrode 16 of CAM memory cells 10 by changing only one mask during the definition process of the latter, thus without increasing the number thereof and in order to manufacture cavities 17 in this floating gate electrode 16.

All of the above U.S. patents, U.S. patent application publications, U.S. patent applications, foreign patents, foreign patent applications and non-patent publications referred to in this specification and/or listed in the Application Data Sheet are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A CAM memory cell integrated on a semiconductor substrate, comprising:
a plurality of floating gate memory cells, matrix-organized in rows, called word lines, and columns, called bit lines, said cells belonging to a same row and having floating gate electrodes being connected with each other in order to form a single floating gate electrode for said CAM memory cell, the single floating gate electrode being equipped with a plurality of cavities manufactured in an alternating sequence in a first and second side wall of the single floating gate electrode.

2. A CAM memory cell according to claim 1, wherein said floating gate memory cells are manufactured in respective active areas delimited by a thick insulating layer, wherein said plurality of cavities are manufactured in correspondence with said thick insulating layer.

3. A CAM memory cell according to claim 1, wherein said plurality of floating gate memory cells comprises five floating gate memory cells.

4. The CAM memory cell of claim 1 wherein the plurality of cavities is an even number of cavities.

5. A CAM memory cell integrated on a semiconductor substrate, comprising:
a plurality of memory cells;
a floating gate electrode coupled to the plurality of memory cells, the floating gate electrode having a first side wall and a second side wall; and
a plurality of cavities formed in alternating positions in the first and second side walls.

6. The CAM memory cell of claim 5, wherein each memory cell of the plurality of memory cells comprises a metal-oxide-silicon (MOS) transistor, the MOS transistor having an active area electrically isolated from other memory cells of the plurality of memory cells by thick insulating layers.

7. The CAM memory cell of claim 6, wherein the plurality of cavities are aligned with the thick insulating layers.

8. The CAM memory cell of claim 6, further comprising:
a control gate electrode; and
an insulating layer formed between the control gate electrode and the floating gate electrode.

9. The CAM memory cell of claim 8, wherein the insulating layer is an interpoly insulating layer.

10. The CAM memory cell of claim 5, wherein the floating gate electrode is a contiguous electrode.

11. A memory device integrated on a semiconductor substrate, comprising:
a plurality of CAM memory cells each including:
a plurality of floating gate memory cells;
a floating gate electrode coupled to the plurality of memory cells, the floating gate electrode having a first side wall and a second side wall; and
a plurality of cavities formed in alternating positions in the first and second side walls.

12. The memory device of claim 11, wherein each CAM memory cell further comprises:
a control gate electrode; and
an insulating layer formed between the control gate electrode and the floating gate electrode.

13. The memory device of claim 11 wherein the plurality of cavities is an even number of cavities.

14. The memory device of claim 11 wherein each floating gate memory cell comprises a respective active area delimited by a thick insulating area.

15. The memory device of claim 14 wherein the cavities in the plurality of cavities are aligned with respective thick insulating areas.

16. A device, comprising:
a first matrix of memory cells; and
a second matrix of memory cells including a plurality of CAM memory cells, the CAM memory cells in the plurality of CAM memory cells each including:
a plurality of floating gate memory cells; and
a floating gate electrode coupled to the plurality of memory cells, the floating gate electrode having a plurality of cavities alternatively located in first and second side walls of the floating gate electrode.

17. The device of claim 16 wherein the floating gate electrode has an even number of cavities.

18. The device of claim 16 wherein the plurality of floating gate memory cells in respective CAM memory cells include active areas delimited by thick insulating layers.

19. The device of claim 18 wherein the cavities are aligned with respective thick insulating layers.

* * * * *

UNITED STATES PATENT AND TRADEMARK OFFICE
CERTIFICATE OF CORRECTION

PATENT NO. : 7,285,816 B2  Page 1 of 1
APPLICATION NO. : 10/926785
DATED : October 23, 2007
INVENTOR(S) : Mauro Bonanomi It is certified that error appears in the above-identified patent and that said Letters Patent is hereby corrected as shown below:

Title Page;
Face of the Patent
Section (75)...Inventor:, "Mauro Bonanomi, Cassano d'Adda (IT)" should read as -- Mauro Bonanomi, Cassano D'Adda (IT) --

Section (57)...Abstract, line 4, "The cells belonging to a same row and have" should read as -- The cells belonging to a same row and having --

Signed and Sealed this

Eleventh Day of November, 2008

JON W. DUDAS
*Director of the United States Patent and Trademark Office*